United States Patent [19]

Wang et al.

[11] 4,202,951
[45] May 13, 1980

[54] BRANCHED POLYPHENYLENE-POLYPHENYLENE SULFIDE BLENDS

[75] Inventors: Chen-Shen Wang, Naperville, Ill.; Sandra K. Koster, Aiken, S.C.

[73] Assignee: Standard Oil Company of Indiana, Chicago, Ill.

[21] Appl. No.: 943,573

[22] Filed: Sep. 18, 1978

Related U.S. Application Data

[63] Continuation of Ser. No. 736,388, Oct. 28, 1976, abandoned.

[51] Int. Cl.² .............................................. C08L 65/02
[52] U.S. Cl. .................................. 525/416; 260/37 R
[58] Field of Search ................... 260/823, 37 R, 37 M

[56] References Cited

U.S. PATENT DOCUMENTS

| 3,555,108 | 1/1971 | Bilow et al. | 260/823 |
|---|---|---|---|
| 3,578,611 | 5/1971 | Bilow et al. | 260/823 |
| 3,582,498 | 6/1971 | Bilow et al. | 260/823 |
| 3,971,748 | 7/1977 | Wang et al. | 260/37 R |
| 3,974,121 | 8/1976 | Wang | 260/823 |

Primary Examiner—Hosea E. Taylor
Assistant Examiner—Amelia B. Yarbrough
Attorney, Agent, or Firm—Wallace L. Oliver; William T. McClain

[57] ABSTRACT

Physical blends of branched polyphenylene and polyphenylene sulfide exhibit superior flexural strength and flexural modulus properties after high-temperature aging to either component alone.

10 Claims, No Drawings

BRANCHED POLYPHENYLENE-POLYPHENYLENE SULFIDE BLENDS

This is a continuation of application Ser. No. 736,388, filed Oct. 28, 1976, now abandoned.

BACKGROUND OF THE INVENTION

This invention relates to branched polyphenylene-polyphenylene sulfide blends and composites made therefrom.

There is a need for polymeric compositions which can withstand high temperatures (above 600° F.) for long periods of time and maintain good mechanical properties. One material which has been disclosed as having good high temperature properties is branched polyphenylene. These polymers are composed essentially of carbon and hydrogen in aromatic ring structures, with the rings chemically linked to each other through ortho, meta and para positions. Such polymers clearly are distinguishable from other chemically similar phenylene-type structures, such as polyphenylene oxide, polyphenylene sulfide, polyphenylene sulfone and other polymers containing the designation "phenylene".

Ordinary polyphenylenes generally have been produced by techniques such as acid catalyzed oxidative coupling of the benzene ring in various aromatic compounds and such polyphenylenes possess some degree of high temperature thermal stability, but they are generally linear (parapolyphenylene) polymers which are relatively insoluble and infusible. Polyphenylenes have been produced which do possess certain limited solubility, but these have generally been at number average molecular weights of only about 1000 to 2000. Generally, these low molecular weight polyphenylenes contain only a low degree of branching, that is, they are still relatively linear polymers which contain long linear segments.

The branched polyphenylenes useful in producing superior blends of this invention are those novel polyphenylenes disclosed by Wennerberg and Wang in U.S. Pat. No. 3,792,099 and produced by the process described in U.S. Pat. Nos. 260,670 3,829,518 and 3,798,281, all of these patents incorporated by reference herein. These polyphenylenes possess increased solubility over prior art polyphenylenes and excellent thermal stability over a number average molecular weight range from 1000 to over 10,000.

Polyphenylene sulfides are crystalline polymers formed from polyhalo aromatics and alkali metal sulfides.

Although branched polyphenylene and polyphenylene sulfide have reasonable high temperature properties neither is adequate for applications such as in air craft bushings or electronic printed circuit boards where good mechanical properties and service temperature above 600° F. are required.

SUMMARY OF THE INVENTION

This invention comprises a blended composition comprising about 50 to 99 parts branched polyphenylene and about 1 to 50 parts polyphenylene sulfide. Such composition can be formed into composites using suitable fillers such as asbestos, glass fibers, mineral fibers, carbon fibers, graphite powder, and mica.

BRIEF DESCRIPTION OF THE INVENTION

Physical blends of branched polyphenylene and polyphenylene sulfide exhibit superior mechanical properties after heat aging to either component alone. Such blends of this invention contain an effective amount of polyphenylene sulfide to increase heat aging properties of the total composition. Generally, the amount of polyphenylene sulfide present in the composition should be from about 1 to about 60 wt. % and typically in the range from about 2 to about 50 wt. %.

In addition to polyphenylene sulfide and branched polyphenylene, suitable fillers can be incorporated with the compositions of this invention to form composites having superior strength, especially after heat aging. Such fillers include asbestos, mineral fibers, glass fibers, carbon fibers, graphite powder, and mica. In a composite formed from a blend of this invention and a suitable filler, typically, the filler constitutes about 50 to 85 wt. %, and preferably, about 70 wt. % of such composite. When forming a composite, the blended polyphenylene composition of this invention preferably should contain about 5 to 35 wt. %, and most preferably, about 10 to 25 wt. % polyphenylene sulfide. Thus a typical composite contains about 70 wt. % filler, 5 wt. % polyphenylene sulfide and about 25 wt. % branched polyphenylene.

The blends of this invention can be formed by mixing in a device such as a Waring blender, in a suitable solvent medium or under intense mixing conditions.

The compositions of this invention can be molded under suitable conditions to form various articles requiring superior heat aging properties, such as printed circuit boards, mechanical seal elements and bearings.

Branched polyphenylene useful in this invention should have at least about 8% by weight of its benzene ring structures bonded to three or more other benzene ring structures, that is, it should be at least 8% branched. Such branched polyphenylene can also be characterized by the relative amounts of the linear infrared absorbance spectrum integrated peak area within the frequency range 726–930 cm$^{-1}$. In general about 7 to 18%, preferably 10 to 18%, of the total integrated peak area within the frequency range 726–930 cm$^{-1}$ shoud fall within the frequency range 854–930 cm$^{-1}$ (I region). The frequency range 806–853 cm$^{-1}$ (P region) generally accounts for about 15 to 30%, preferably 18 to 26%, of the total integrated peak area. The frequency range 778–805 cm$^{-1}$ (M region) accounts for about 13 to 20% of the total integrated peak area.

Branched polyphenylene alternatively can be characterized by the amount of the various types of benzene ring structures present in the polymer chains, which is determined according to the equation:

$$c = A/b\, a^*.$$

In this equation the term "A" is the planimeter area reading for the particular absorption frequency range corrected by a constant factor relating to the planimeter used in the measurement and is in units of cm$^{-1}$. The values of A for the region between 854 and 930 cm$^{-1}$ are corrected for the presence of meta-disubstituted benzene ring structures by applying a correction factor obtained from the value of A for the region 778–805 cm$^{-1}$. The correction factor is one-third of the A value for the 778–805 cm$^{-1}$ region. The term "b" is the thickness of the KBr pellet in units of cm. The term "a*" is the integrated absorptivity in units of g$^{-1}$ l cm$^{-2}$. The values for a* are obtained from the integrated peak areas of the reference compounds determined under essentially the same operating conditions used for obtaining the spectra for the polyphenylenes. The term "c" is the concentration, in grams per liter, of any of the characteristic benzene ring structures associated with the regions of I, P, M and PH. The amount of the various types of benzene ring structures present in the polymer chain is determined by dividing the measured concentration obtained from a particular frequency range by the sum of the concentrations obtained from the four frequency ranges involved. Further details of this procedure are described in U.S. Pat. No. 3,792,099.

By the above-described analysis, the amount of benzene ring structures in the branched polyphenylene polymer chains which are at least trisubstituted, that is, bonded to three or more other benzene ring structures, is at least about 8% by weight, preferably 10% by weight and is more preferably from about 12 to about 25 percent by weight. The amount of benzene ring structures which are disubstituted, bonded to two other benzene ring structures through either the para, meta, or ortho positions, is preferably from about 45 to about 65 percent by weight. The amount of benzene ring structures which are meta-disubstituted, bonded through the meta position to two other benzene ring structures, is preferably from about 15 to about 35 percent by weight. The terminology "double bonding through the meta position" refers to the bonding of a benzene ring structure to two other benzene ring structures through the meta positions of the benzene ring structure. The remaining benzene ring structure in the polymer chains are bonded to only one other benzene ring structure. The polymer is composed from simple phenylene units rather than from fused rings.

The inherent viscosity of the branched polyphenylenes can vary from about 0.025 or less to more than 0.17 when measured in trichlorobenzene at 135° C. at a concentration of 0.02 g/ml. This roughly corresponds to a number average molecular weight range of from 1000 or less to greater than 10,000. A number average molecular weight range of about 3,000 to 10,000 is particularly advantageous for the preparation of the nitropolyphenylenes of this invention.

A particularly preferred branched polyphenylene resin is that prepared from biphenyl by the dehydrogenative coupling process described in U.S. Pat. Nos. 3,829,518 and 3,798,281.

The polyphenylene sulfides useful in this invention are polymers produced from polyhalo-substituted aromatic compounds and alkali metal sulfides in a polar organic solvent at elevated temperatures. The preferred polyphenylene sulfide contains recurring units of

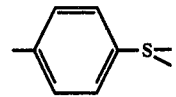

and can be formed by reacting p-dichlorobenzene with sodium sulfide. Such material is sold by Phillips Petroleum Company under the name Ryton. Generally, this material is not soluble in any solvent below 200° C. but at higher temperatures is slightly soluble in some aromatics, chloroaromatics and heterocyclic compounds. The inherent viscosity of such material typically is 0.16 measured at 206° C. in 1-chloronaphthalenes. The annealed polymer is highly crystalline as shown by X-ray diffraction and has a crystalline melting point near 285° C. This product is described further in "Polyphenylene Sulfide: A New Industrial Resin" by G. C. Baily and H. Wayne Hill, Jr., New Industrial Polymers, Division of Organic Coatings and Plastics Symposium, A.C.S. Symposium Series 1974 and in U.S. Pat. No. 3,354,129, both incorporated by reference herein.

This invention is demonstrated but not limited by the following examples.

EXAMPLE I

Ten grams of branched polyphenylene (inherent viscosity =0.09) was blended with ten grams of polyphenylene sulfide (Ryton p-4) and the resulting mixture was placed in a 2"×2.5" mold and cold pressed at 3000 psi to form a plaque which was removed from the mold and cured in an air oven for one hour each at 400° F., 500° F. and 700° F. After cooling, the cracked sample was placed back into the mold and pressed at 1600 psi at 600° F. for five minutes. The mold was cooled slowly at 4° F./minute and the sample removed at 260° F. A plaque of pure polyphenylene sulfide was prepared using the same molding conditions. The mechanical properties before and after heat aging at 600° F. in air for 17 days are shown in Table I.

TABLE I

| Example (Run) | Branched Polyphenylene (%) | Polyphenylene Sulfide (%) | Mechanical Properties (psi) | | | |
|---|---|---|---|---|---|---|
| | | | Flexural Strength | | Flexural Modulus | |
| | | | Before Aging | After Aging | Before Aging | After Aging |
| A | — | 100 | 2,200 | 8,900 | 348,000 | 360,000 |
| B | 100 | — | (1) | — | (1) | — |
| I | 50 | 50 | 1,900 | 13,800 | 431,000 | 836,000 |

(1) Shattered

EXAMPLE II

A branched polyphenylene-polyphenylene sulfide composite was formed incorporating asbestos fiber by molding a mixture of 27 wt. % branched polyphenylene (IV=0.8), 3 wt. % polyphenylene sulfide (Ryton p-4) and 70 wt. % asbestos fibers at 800° F. at 3000 psi for 10 minutes. The composite had a flexural strength of 9,700 psi and a flexural modulus of 2,209,000 psi before heat aging at 600° F. in air for 28 days and 9,400 psi and 1,117,000 psi respectively after aging.

EXAMPLES III-IV

Asbestos fiber-containing composites were formed as described in Example II. The results are shown in Table II.

TABLE II

| Example (Run) | Branched Polyphenylene (%) | Polyphenylene Sulfide (%) | Asbestos Fiber[1] (%) | Mechanical Properties (psi) | | | |
|---|---|---|---|---|---|---|---|
| | | | | Flexural Strength | | Flexural Modulus | |
| | | | | Before Aging | After Aging | Before Aging | After Aging |
| III | 22.5[2] | 7.5 | 70 | 9,800 | 9,400 | 1,730,000 | 1,338,000 |
| IV | 27.0[2] | 3.0 | 70 | 9,200 | 14,900 | 1,698,000 | 1,540,000 |
| B | — | 30 | 70 | 14,400 | 8,800 | 1,835,000 | 935,000 |
| C[4] | 43.2[3] | — | 56.8 | 7,600 | 8,800 | 1,384,000 | 1,110,000 |

[1]Grade 7D-1, 1/16 inch length
[2]IV = 0.08
[3]IV = 0.10
[4]Molded at 950° F. at 1600 psi for 10 minutes.

We claim:

1. A moldable blended polyphenylene composition exhibiting superior heat aging properties comprising about 40 to 99 wt. % branched polyphenylene containing at least 8 wt. % benzene ring structures which are at least trisubstituted and nonfused and about 1 to 60 wt. % polyphenylene sulfide.

2. A blended composition of claim 1 containing about 2 to 50 wt. % polyphenylene sulfide.

3. A composite containing about 15 to 50 wt. % of the blended composition of claim 1 and about 50 to 85 wt. % of a suitable filler.

4. A composite of claim 3 wherein the filler is asbestos, mineral fiber, glass fiber, carbon fiber, graphite powder, mica or a mixture thereof.

5. A composite of claim 4 wherein the filler is asbestos.

6. A composite of claim 3 wherein polyphenylene blend contains about 5 to 35 wt. % polyphenylene sulfide.

7. A composite of claim 6 wherein the polyphenylene blend contains about 10 to 25 wt. % polyphenylene sulfide.

8. A composite of claim 3 containing about 70 wt. % filler.

9. A composite of claim 5 wherein the polyphenylene blend contains about 5 to 35 wt. % polyphenylene sulfide.

10. A composite of claim 5 containing about 70 wt. % asbestos, about 5 wt. % polyphenylene sulfide and about 25 wt. % branched polyphenylene.

UNITED STATES PATENT OFFICE
CERTIFICATE OF CORRECTION

Patent No. 4,202,951         Dated May 13, 1980

Inventor(s) Chen-Shen Wang and Sandra K. Koster

It is certified that error appears in the above-identified patent and that said Letters Patent are hereby corrected as shown below:

Column 1, lines 46-47  "U.S. Pat. Nos. 260,670 3,829,518 and 3,798,281" should be --U.S. Pat. Nos. 3,829,518 and 3,798,281--.

Column 4, lines 2-6  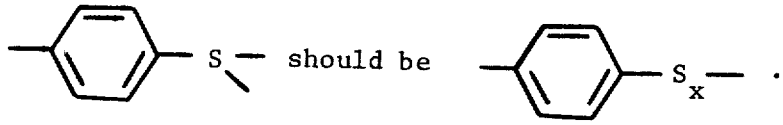

Column 4, lines 32-33  "400°F., 500°F. and 700°F." should be
--400°F., 500°F., 600°F. and 700°F.--.

Signed and Sealed this

Twenty-eighth Day of October 1980

[SEAL]

Attest:

SIDNEY A. DIAMOND

Attesting Officer     Commissioner of Patents and Trademarks